(12) United States Patent
Su

(10) Patent No.: US 6,897,566 B2
(45) Date of Patent: May 24, 2005

(54) ENCAPSULATED SEMICONDUCTOR PACKAGE FREE OF CHIP CARRIER

(75) Inventor: Huan-Ping Su, Hsinchu (TW)

(73) Assignee: Ultra Tera Corporation, Hsinchu (TW)

( * ) Notice: Subject to any disclaimer, the term of this patent is extended or adjusted under 35 U.S.C. 154(b) by 0 days.

(21) Appl. No.: 10/179,793

(22) Filed: Jun. 24, 2002

(65) Prior Publication Data

US 2003/0234442 A1 Dec. 25, 2003

(51) Int. Cl.$^7$ .................. H01L 23/28; H01L 23/48
(52) U.S. Cl. .............. 257/778; 257/737; 257/738; 257/734; 257/692; 257/712; 257/713; 257/790; 257/707; 257/678; 257/788; 257/787; 228/180.22
(58) Field of Search ................ 257/678, 778, 257/737, 738, 734, 692, 693, 598, 787, 788, 712, 713, 790, 707

(56) References Cited

U.S. PATENT DOCUMENTS

| | | | | |
|---|---|---|---|---|
| 5,373,190 A | * | 12/1994 | Ichiyama | 257/737 |
| 5,558,271 A | * | 9/1996 | Rostoker et al. | 228/180.22 |
| 5,640,051 A | * | 6/1997 | Tomura et al. | 257/778 |
| 5,641,113 A | * | 6/1997 | Somaki et al. | 228/180.22 |
| 5,977,641 A | * | 11/1999 | Takahashi et al. | 257/778 |
| 6,046,071 A | * | 4/2000 | Sawai et al. | 438/106 |
| 6,177,731 B1 | * | 1/2001 | Ishida et al. | 257/780 |
| 6,387,734 B1 | * | 5/2002 | Inaba et al. | 438/125 |
| 6,410,988 B1 | * | 6/2002 | Caletka et al. | 257/778 |
| 6,429,043 B1 | * | 8/2002 | Nakazawa et al. | 438/106 |
| 6,476,503 B1 | * | 11/2002 | Imamura et al. | 257/780 |
| 6,518,651 B2 | * | 2/2003 | Hashimoto | 257/669 |
| 2002/0011677 A1 | * | 1/2002 | Yokoi et al. | 257/782 |
| 2002/0121706 A1 | * | 9/2002 | Tatsuta et al. | 257/778 |
| 2003/0067084 A1 | * | 4/2003 | Shintani | 257/778 |
| 2003/0071348 A1 | * | 4/2003 | Eguchi et al. | 257/723 |
| 2003/0071352 A1 | * | 4/2003 | Ohuchi et al. | 257/737 |

* cited by examiner

Primary Examiner—Alexander Oscar Williams
(74) Attorney, Agent, or Firm—Sawyer Law Group LLP

(57) ABSTRACT

A semiconductor package and a method for fabricating the same are proposed. A chip has an active surface, and an opposing non-active surface. A plurality of conductive elements are mounted on the active surface and electrically connected to the chip. A first encapsulant is formed on the active surface of the chip, for encapsulating the active surface and conductive elements, wherein end portions of the conductive elements are exposed to outside of the first encapsulant, and adapted to be recessed in position with respect to an exposed surface of the first encapsulant. A plurality of conductive media are implanted at end portions of the conductive elements, allowing the chip to be electrically connected to an external device by the conductive elements and conductive media. A second encapsulant is formed on the non-active surface of the chip, and cooperates with the first encapsulant to provide mechanical strength for the semiconductor package.

15 Claims, 3 Drawing Sheets

ENCAPSULATED SEMICONDUCTOR PACKAGE FREE OF CHIP CARRIER

FIELD OF THE INVENTION

The present invention relates to semiconductor packages, and more particularly, to a semiconductor package, wherein a chip is electrically connected to an external device by a plurality of array-arranged conductive elements.

BACKGROUND OF THE INVENTION

In compliance with demand for low profile electronic products, such as notebook (NB), personal digital assistant (PDA), or set top box, besides improvement in component integration technology, internal components thereof are also preferably dimensioned with reduced volume, thickness or weight. Therefore, for a semiconductor package, which is a core component of an electronic product, it has been endeavored in the art to effectively reduce height and size of the semiconductor package.

Profile miniaturization for semiconductor packages is effected as developing from a leadframe-based package to a BGA (ball grid array) package, and further to a chip scale package (CSP). However, such a CSP still has significant drawbacks. First, in the CSP, a chip is electrically connected to a substrate by bonding wires that extend radially from a periphery of the chip to the substrate, thereby making size of the CSP hardly reduced in consideration of height of wire loops and area on the substrate occupied by the bonding wires. Moreover, if a flip chip is adopted in the CSP for electrically connecting the flip chip to the substrate by means of solder bumps, overall height of the CSP is still hardly reduced by combining heights of the flip chip, solder bumps, substrate and solder balls implanted beneath the substrate. And, the use of flip-chip technology would also undesirably increase costs and process complexity in fabrication. Further, provision of the substrate would increase overall structural height, and also fabrication costs of the CSP by taking account of relatively high costs in substrate manufacture. In addition, in the CSP, due to mismatch in coefficient of thermal expansion (CTE) among the chip, the substrate and an encapsulant that encapsulates the chip, thermal stress would be produced and applied on the chip, thereby causing warpage or delamination to the CSP during temperature variation in fabrication processes, a reliability test or practical use, which would adversely affect reliability and yield of fabricated products.

There is disclosed a semiconductor package without using a substrate in Taiwan Patent No. 16123 entitled "SEMI-CONDUCTOR PACKAGE WITHOUT CHIP CARRIER AND METHOD OF MAKING THE SAME". This patent is characterized by forming an encapsulant for encapsulating both active and non-active surfaces of a chip in the semiconductor package, so as to provide desirable mechanical strength and protection for the chip, without having to use a chip carrier e.g. substrate. Such a package structure indeed effectively contributes to overall profile reduction; however, it is still inherent with significant drawbacks. For example, end portions of conductive elements mounted on the active surface of the chip, are flush with an exposed surface of the encapsulant formed on the active surface. When implanting conductive media e.g. tin balls, solder bumps or solder paste on the end portions of the conductive elements, during a solder-reflowing process, due to lack of an anchoring mechanism between the conductive media and the end portions, the conductive media may not be firmly held in position, but collapse or melt to contaminate adjacent conductive media; this leads to bridging or short circuit between conductive media, and the bridging effect may allow a conductive medium to be partly or completely absorbed by an adjacent conductive medium due to cohesion difference between the bridged conductive media. This makes the conductive media variably dimensioned in size or height, leading to incomplete electrical connection between the semiconductor package and an external device. Therefore, how to overcome the above problems for preventing conductive media for contacting or short-circuiting with each other, is now an important topic to endeavor.

SUMMARY OF THE INVENTION

An objective of the present invention is to provide a semiconductor package, which can effectively prevent undesirable contact or short circuit between adjacent conductive media during a solder-reflowing process, so as to improve quality of electrical connection between the conductive media and an external device.

Another objective of the invention is to provide a semiconductor package without using a chip carrier, thereby reducing fabrication costs thereof.

A further objective of the invention is to provide a semiconductor package with sufficient mechanical strength, by which warpage or delamination can be prevented from occurrence.

A further objective of the invention is to provide a semiconductor package, allowing overall thickness and area thereof to be effectively reduced.

In accordance with the above and other objectives, the present invention proposes a semiconductor package, comprising: a chip having an active surface and a non-active surface opposed to the active surface; a plurality of conductive elements mounted on the active surface of the chip and electrically connected to the chip; a first encapsulant formed on the active surface of the chip, for hermetically encapsulating the active surface and the conductive elements in a manner that, end portions of the conductive elements are each exposed to outside of the first encapsulant, and adapted to be recessed in position with respect to an exposed surface of the first encapsulant; a plurality of conductive media implanted at the exposed end portions of the conductive elements, and electrically connected to the conductive elements; and/or a second encapsulant formed on the non-active surface of the chip.

The above semiconductor package can provide significant benefits. First, the conductive elements are partly removed by etching or laser technology via the exposed end portions thereof so as to form a plurality of recessed grooves respectively, whereby the conductive media can be implanted and firmly anchored at the grooves of the conductive elements, without collapsing laterally to contaminate or short-circuit with adjacent conductive media during a solder-reflowing process. This also allows the conductive media to be more evenly sized, making reliability and yield of fabricated products desirably improved. Moreover, the first and/or second encapsulant formed on the chip would effectively enhance mechanical strength for the chip and overall package structure, without having to use a chip carrier such as substrate or lead frame, thereby helping reduce fabrication costs and structural profile of the semiconductor package. Further with sufficient mechanical strength being provided by the first and/or second encapsulant, the semiconductor package can be prevented from occurrence of warpage or delamination, in favor of assuring quality of fabricated products.

BRIEF DESCRIPTION OF THE DRAWINGS

The present invention can be more fully understood by reading the following detailed description of the preferred embodiments, with reference made to the accompanying drawings, wherein.

DETAILED DESCRIPTION

Figure 1:
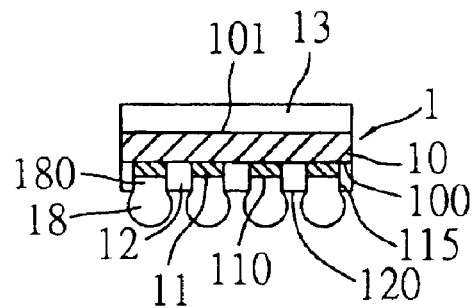
FIG. 1 is a cross-sectional view of a semiconductor package according to a first embodiment of the invention.

FIG. 1 illustrates a semiconductor package 1 according to a first embodiment of the present invention. As shown FIG. 1, the semiconductor package 1 is provided with a chip 10 having an active surface 100 and a non-active surface 101 opposed to the active surface 100, wherein a plurality of contacts (not shown) are formed on the active surface 100, for allowing a plurality of connecting bumps 11 made of conductive metal to be implanted at corresponding contacts by conventional printing technique. Each of the contacts on the active surface 100 can be a bond pad, or a connecting pad that is formed by redistributing a corresponding bond pad and electrically connected to the redistributed bond pad by conductive traces. Thereby, the chip 10 would be electrically coupled to the connecting bumps 11 that are bonded to the active surface 100 of the chip 10. Since forming of bond pads or connecting pads employs conventional technology, it is not to be further described herein.

Moreover, a first encapsulant 12 made of a conventional resin compound e.g. epoxy resin, is formed on the active surface 100 of the chip 10, so as to hermetically encapsulate and protect the active surface 100 of the chip 10 against external moisture or contaminant. The first encapsulant 12 is adapted to encapsulate the connecting bumps 11, and then ground horizontally to be reduced to a predetermined thickness by which an exposed surface 120 of the first encapsulant 12 is flush with end portions 110 of the connecting bumps 11, allowing the end portions 110 of the connecting bumps 11 to be exposed to outside of the first encapsulant 12. Next, the connecting bumps 11 are partly removed by etching or laser technology via the exposed end portions 110 thereof, so as to form a plurality of recessed grooves 115 respectively. Conductive media 18 such as solder balls are bonded to the grooves 115 by conventional ball-implantation technique, allowing the conductive media 18 to be electrically connected to the connecting bumps 11. With provision of the grooves 115, root portions 180 of the conductive media 18 can be anchored in the grooves 115, making the conductive media 18 firmly held in position on the first encapsulant 12. By virtue of material cohesion force, during a solder-reflowing process, the conductive media 18 would cohere toward the root portions 180 thereof, and less likely collapse to contaminate unintended part of the exposed surface 120 of the first encapsulant 12. This effectively eliminates undesirable contact or short circuit between adjacent conductive media 18, and forming of unevenly sized conductive media 18, thereby improving quality of electrical connection between the conductive media 18 and an external device (not shown). Further, due to relatively small mismatch in coefficient of thermal expansion (CTE) between the first encapsulant 12 and a common external device e.g. printed circuit board (PCB), when the semiconductor package 1 is electrically coupled to the PCB by SMT (surface mount technology) or solder-reflowing process, the semiconductor package 1 would not be adversely damaged by effect of CTE mismatch.

Besides, a second encapsulant 13 can be formed on the non-active surface 101 of the chip 10, allowing the chip 10 to be interposed between the first and second encapsulants 12, 13. Such a sandwich structure provides further support and mechanical strength for the chip 10 and the semiconductor package 1, without having to use a chip carrier such as substrate or lead frame. Moreover, as the first and second encapsulants 12, 13 are preferably made of the same resin compound, during a temperature cycle, thermal stress applied from the lower first encapsulant 12 to the chip 10 would mostly counteract that from the upper second encapsulant 13. Thereby, warpage or delamination can be prevented from occurrence, making yield and reliability of the semiconductor package 1 effectively improved.

Therefore, the above semiconductor package 1 is advantageous of not using a substrate or lead frame as a chip carrier, which can reduce fabrication costs, process complexity and overall package profile as desired, allowing surface area of the semiconductor package 1 to be preferably down-sized to that of the chip 10. And, a fabricated semiconductor package 1 can be directly connected to an external device, or mounted on a substrate to form a flip-chip structure.

Figure 2:
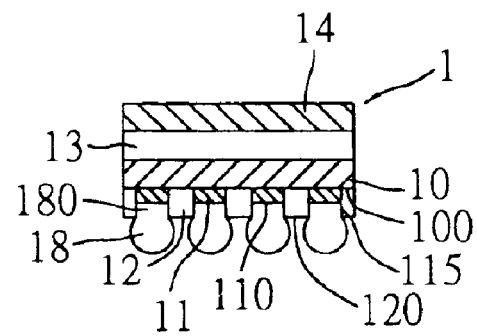
FIG. 2 is a cross-sectional view of the semiconductor package of FIG. 1 mounted with a heat sink.

Additionally, for further enhancing mechanical strength and heat dissipation efficiency of the semiconductor package 1, a heat sink (not shown) can be directly attached to the non-active surface 101 of the chip 10, or a heat sink 14 can be mounted on the second encapsulant 13 (as shown in FIG. 2). Such a heat sink is externally connected to the chip 10, and thus, it can be flexibly dimensioned according to practical use, without being particularly limited in thickness, shape and size thereof.

Figure 3:
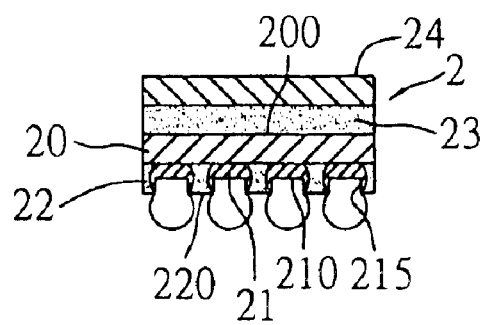
FIG. 3 is a cross-sectional view of a semiconductor package according to a second embodiment of the invention.

FIG. 3 illustrates a semiconductor package 2 according to a second embodiment of the invention. This semiconductor package 2 is structurally similar to the above semiconductor package 1 of the first embodiment, and differs from the semiconductor package 1 only in that, solder balls 21 instead of connecting bumps 11 are implanted on an active surface 200 of a chip 20. As shown in FIG. 3, a first encapsulant 22 is formed to encapsulate the solder balls 21, and horizontally ground to reduce thickness of the first encapsulant 22 and height of the solder balls 21, wherein end portions 210 of the solder balls 21 are exposed to outside of the first encapsulant 22, and flush with an exposed surface 220 of the first encapsulant 22; then, the solder balls 21 are similarly partly removed by etching or laser technology to formed a plurality of grooves 215 recessed from the exposed end portions 210 thereof.

FIGS. 4A to 4G illustrate fabrication processes for a semiconductor package according to an embodiment of the invention.

Figure 4A:
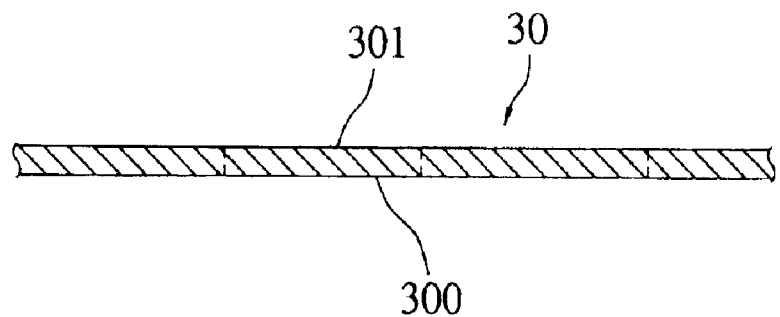
FIGS. 4A–4I are cross-sectional diagrams showing process steps for fabricating a semiconductor package according to an embodiment of the invention.

Referring to FIG. 4A, the first step is to prepare a wafer 30 having an active surface 300 and a non-active surface 301 opposed to the active surface 300. The wafer 30 is defined with a plurality of chip units (as bordered by dotted lines in the drawing).

Figure 4B:
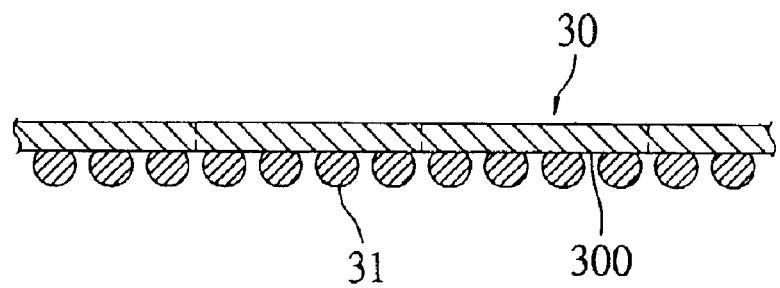

Referring to FIG. 4B, the next step is to implant a plurality of first solder balls 31 on the active surface 300 of the wafer 30 by a conventional ball-implantation process, allowing each of the first solder balls 31 to be electrically connected to the wafer 30.

Figure 4C:
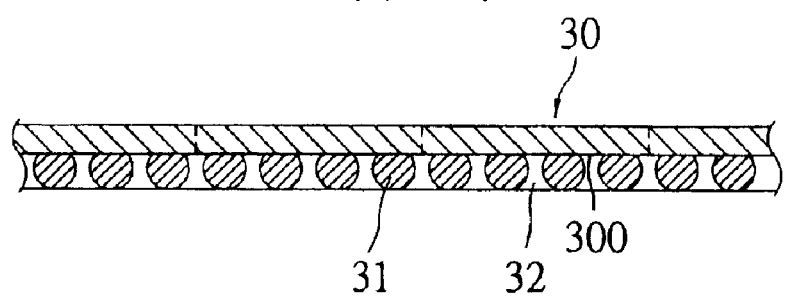

Referring further to FIG. 4C, a first encapsulant 32 made of epoxy resin is formed on the active surface 300 of the wafer 30 in a manner as to encapsulate the first solder balls 31. The first encapsulant 32 is used to provide support and mechanical strength for the wafer 30, and also hermetically encapsulate the active surface 300 of the wafer 30. Forming of the first encapsulant 32 can be implemented by conventional printing or dispensing technique.

Figure 4D:
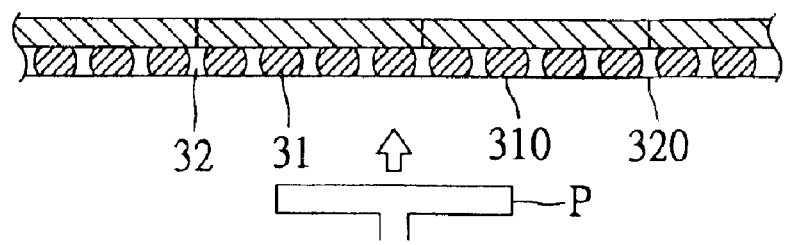

Referring to FIG. 4D, the first encapsulant 32 and the first solder balls 31 are horizontally ground by using a grinder P, so as to reduce thickness of the first encapsulant 32 and height of the first solder balls 31 to a predetermined value, whereby end portions 310 of the first solder balls 31 can be exposed to outside of the first encapsulant 32, and flush with an exposed surface 320 of the first encapsulant 32. It is to be noted that, in the case of using the foregoing connecting bumps instead of the first solder balls 31, as the connecting bumps and a first encapsulant can be desirably dimensioned during fabrication, this grinding step may be optionally omitted.

Figure 4E:
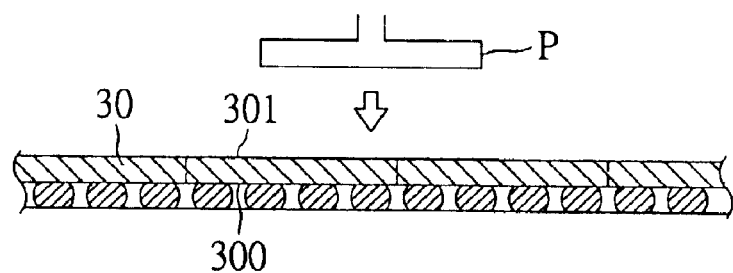

Referring to FIG. 4E, with strong mechanical strength being provided from the first encapsulant 32 for the wafer 30, the non-active surface 301 of the wafer 30 can be readily subject to grinding by using a grinder P for reducing thickness of the wafer 30, without damaging structure of the wafer 30 or electronic components and circuits formed on the active surface 300. It should be noted that, if the wafer 30 can be desirably dimensioned in thickness, or wafer thickness is not critically considered for fabricated products, this grinding step may be optionally omitted.

Figure 4F:
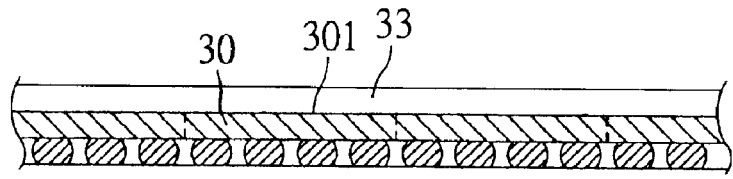

Referring to FIG. 4F, a second encapsulant 33 made of epoxy resin is optionally formed on the non-active surface 301 of the wafer 30. The second encapsulant 33 is preferably dimensioned in thickness to further enhance mechanical strength of the wafer 30 in cooperation with the first encapsulant 32. And, thickness of the second encapsulant 33 can be optionally reduced by grinding technique if necessary.

Figure 4G:
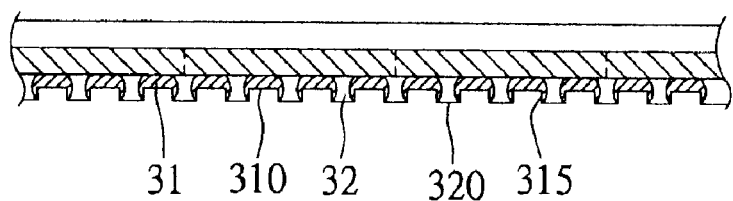

Referring to FIG. 4G, the first solder balls 31 (or connecting bumps) are each partly removed by etching or laser technology via the exposed end portions 310 thereof, so as to form a plurality of grooves 315 that are respectively recessed from the end portions 310 of the first solder balls 31 (or end portions of connecting bumps).

Figure 4H:
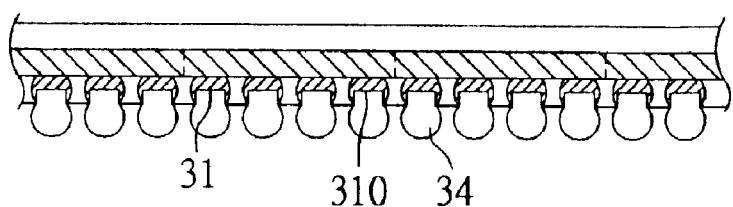

Referring to FIG. 4H, a plurality of second solder balls 34 are implanted at the grooves 315 by a conventional ball-implantation process, allowing the second solder balls 34 to be electrically connected to the first solder balls 31, such that the wafer 30 can be electrically coupled to an external device (not shown) through the second solder balls 34.

Figure 4I:
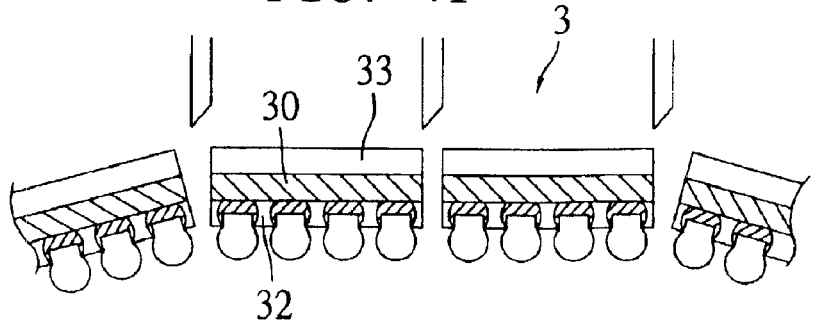

Finally, referring to FIG. 4I, a cutting machine is used to separate apart respective chip units defined on the wafer 30 (by cutting along dotted lines as indicated in the drawing), so as to form a plurality of individual semiconductor packages 3.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
    a chip having an active surface and a non-active surface opposed to the active surface;
    a plurality of conductive elements mounted on the active surface of the chip and electrically connected to the chip;
    a first encapsulant formed only on the active surface of the chip, for hermetically encapsulating the active surface and the conductive elements in a manner that, end portions of the conductive elements are each exposed to outside of the first encapsulant, and adapted to be recessed in position with respect to an exposed surface of the first encapsulant; and
    a plurality of conductive media implanted at the exposed end portions of the conductive elements, and electrically connected to the conductive elements.

2. The semiconductor package of claim 1, further comprising a second encapsulant formed on the non-active surface of the chip.

3. The semiconductor package of claim 2, further comprising a heat sink mounted on the second encapsulant.

4. The semiconductor package of claim 1, wherein the conductive elements are solder balls made of conductive metal.

5. The semiconductor package of claim 1, wherein the conductive elements are connecting bumps made of conductive metal.

6. The semiconductor package of claim 1, wherein the conductive media are solder bumps made of conductive metal.

7. The semiconductor package of claim 1, wherein the conductive media are solder balls made of conductive metal.

8. The semiconductor package of claim 1, wherein the conductive media are solder paste.

9. The semiconductor package of claim 2, wherein the first and second encapsulants are each made of a resin compound.

10. A semiconductor package, comprising:
    a chip having an active surface and a non-active surface opposed to the active surface;
        a plurality of conductive elements mounted on the active surface of the chip;
        a first encapsulant formed only on the active surface of the chip such that end portions of the conductive elements are flush with an exposed surface of the first encapsulant, and each of the end portions is formed with a recessed groove;
        a plurality of conductive media implanted at the exposed end portions and bonded to the recessed grooves of the conductive elements.

11. The semiconductor package of claim 10, further comprising a second encapsulant formed on the non-active surface of the chip.

12. The semiconductor package of claim 11, further comprising a heat sink mounted on the second encapsulant.

13. The semiconductor package of claim 10, wherein the conductive elements are solder balls or connecting bumps.

14. The semiconductor package of claim 10, wherein the conductive media are solder bumps, solder balls, or solder paste.

15. The semiconductor package of claim 11, wherein the first and second encapsulants are each made of a resin compound.

* * * * *